(12) United States Patent
Oh et al.

(10) Patent No.: US 12,185,541 B2
(45) Date of Patent: Dec. 31, 2024

(54) SEMICONDUCTOR MEMORY DEVICE OF VERTICAL CHANNEL STRUCTURE AND METHOD OF MANUFACTURING THE SAME

(71) Applicant: SK hynix Inc., Icheon-si Gyeonggi-do (KR)

(72) Inventors: Jae Young Oh, Icheon-si (KR); Dong Hwan Lee, Icheon-si (KR); Eun Seok Choi, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 434 days.

(21) Appl. No.: 17/543,496

(22) Filed: Dec. 6, 2021

(65) Prior Publication Data

US 2022/0399366 A1    Dec. 15, 2022

(30) Foreign Application Priority Data

Jun. 14, 2021    (KR) .................... 10-2021-0076987

(51) Int. Cl.
*H10B 43/27*   (2023.01)
*H10B 41/27*   (2023.01)
*H10B 41/30*   (2023.01)
*H10B 43/30*   (2023.01)

(52) U.S. Cl.
CPC ............ *H10B 43/27* (2023.02); *H10B 41/27* (2023.02); *H10B 41/30* (2023.02); *H10B 43/30* (2023.02)

(58) Field of Classification Search
None
See application file for complete search history.

(56) References Cited

U.S. PATENT DOCUMENTS

| 10,629,616 | B1 | 4/2020 | Kai et al. |
| 2021/0202458 | A1* | 7/2021 | Jung ............ H10B 43/27 |
| 2023/0061301 | A1* | 3/2023 | Kim ............. H10B 43/35 |

FOREIGN PATENT DOCUMENTS

KR     1020220039275 A    3/2022

* cited by examiner

*Primary Examiner* — Nduka E Ojeh
(74) *Attorney, Agent, or Firm* — WILLIAM PARK & ASSOCIATES LTD.

(57) ABSTRACT

A semiconductor memory device, and a method of manufacturing the same, includes a gate stack including an interlayer insulating layers and conductive patterns alternately stacked in a vertical direction on a substrate, a channel structure passing through the gate stack and having an upper end protruding above the gate stack, a memory layer surrounding a sidewall of the channel structure, and a source layer formed on the gate stack. The channel structure includes a core insulating layer extending in a central region of the channel structure in the vertical direction, and a channel layer surrounding a sidewall of the core insulating layer, the channel layer formed to be lower in the vertical direction than the core insulating layer and the memory layer.

11 Claims, 18 Drawing Sheets

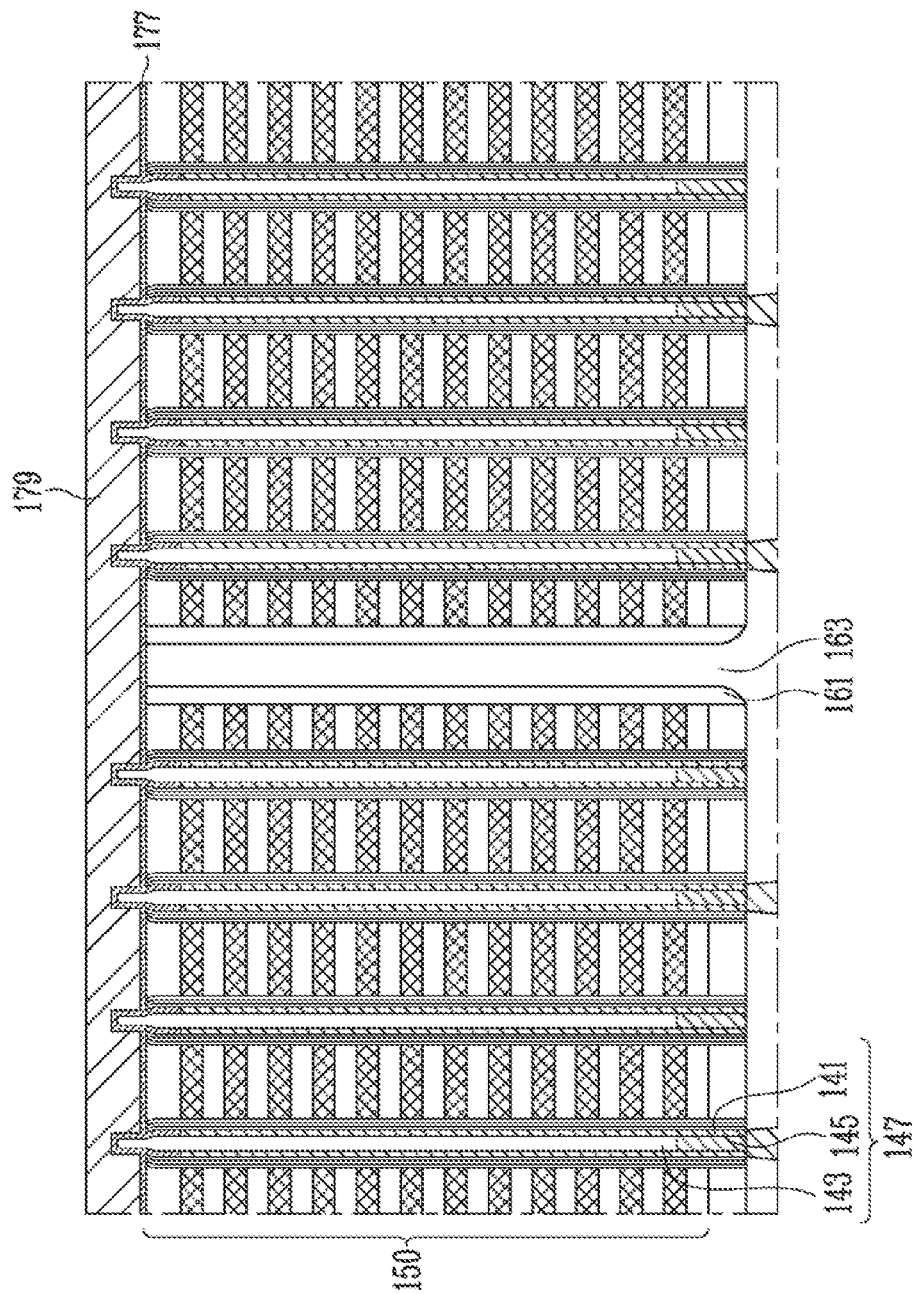

SEMICONDUCTOR MEMORY DEVICE OF VERTICAL CHANNEL STRUCTURE AND METHOD OF MANUFACTURING THE SAME

CROSS-REFERENCE TO RELATED APPLICATION

The present application claims priority under 35 U.S.C. § 119(a) to Korean patent application number 10-2021-0076987, filed on Jun. 14, 2021, which is incorporated herein by reference in its entirety.

BACKGROUND

1. Technical Field

The present disclosure relates to an electronic device, and more particularly, to a semiconductor memory device of a vertical channel structure and a method of manufacturing the same.

2. Related Art

Recently, a paradigm for a computer environment has been transformed into a ubiquitous computing standard, whereby computer systems are available for use virtually anywhere and at any time. Therefore, use of portable electronic devices such as mobile phones, digital cameras, and notebook computers is rapidly increasing. Such portable electronic devices generally use a semiconductor memory system that uses a memory device, that is, a data storage device. The data storage device may be used as a main storage device or an auxiliary storage device of a portable electronic device.

A data storage device using a semiconductor memory device has advantages in that stability and durability are excellent because there is no mechanical driver, access speed of information is very fast, and power consumption is low. As an example of a memory system having such advantages, a data storage device includes a universal serial bus (USB) memory device, a memory card having various interfaces, a solid state drive (SSD), and the like.

A semiconductor memory device is generally classified as a volatile memory device or a nonvolatile memory device.

Read and write speeds of nonvolatile memory devices are relatively slow, however, nonvolatile memory devices maintain stored data even when a supply of power is cut off. Therefore, nonvolatile memory devices are used to store data to be maintained regardless of supplied power. Nonvolatile memory devices may include read only memory (ROM), mask ROM (MROM), programmable ROM (PROM), erasable programmable ROM (EPROM), electrically erasable programmable ROM (EEPROM), flash memory, phase change random access memory (PRAM), magnetic RAM (MRAM), resistive RAM (RRAM), ferroelectric RAM (FRAM), or the like. Flash memory is generally classified as NOR type or NAND type.

SUMMARY

An embodiment of the present disclosure provides a semiconductor memory device capable of more uniformly forming a process junction region for connecting a channel layer and a source layer of a vertical channel structure, and a method of manufacturing the same.

According to an embodiment of the present disclosure, a semiconductor memory device includes a gate stack including an interlayer insulating layers and conductive patterns alternately stacked in a vertical direction on a substrate, a channel structure passing through the gate stack and having an upper end protruding above the gate stack, a memory layer surrounding a sidewall of the channel structure, and a source layer formed on the gate stack. The channel structure includes a core insulating layer extending in a central region of the channel structure in the vertical direction, and a channel layer surrounding a sidewall of the core insulating layer, the channel layer being lower in the vertical direction than the core insulating layer and the memory layer.

According to an embodiment of the present disclosure, a method of manufacturing a semiconductor memory device includes forming a memory cell array on a substrate so that the memory cell array includes a gate stack including interlayer insulating layers and conductive patterns alternately stacked in a vertical direction, a core insulating layer passing through the gate stack and having an end extending into the substrate, a channel layer surrounding a sidewall and the end of the core insulating layer, and a memory layer extending from a region between the channel layer and the gate stack to a region between an end of the channel layer and the substrate. The method also includes removing the substrate to expose the memory layer. The method additionally includes exposing the core insulating layer by etching the exposed memory layer and the channel layer, and forming an opening between an upper end of the memory layer and an upper end of the core insulating layer by etching the exposed memory layer and the channel layer so that an upper surface height of the channel layer is lower than an upper surface of the gate stack. The method further includes forming a first source layer to surround the upper surface of the gate stack and a protrusion of the core insulating layer and to fill the opening.

According to an embodiment of the present disclosure, a method of manufacturing a semiconductor memory device includes forming a memory cell array on a substrate so that the memory cell array includes a gate stack including interlayer insulating layers and conductive patterns alternately stacked in a vertical direction, a core insulating layer passing through the gate stack and having an end extending into the substrate, a channel layer surrounding a sidewall and the end of the core insulating layer, and a memory layer extending from a region between the channel layer and the gate stack to a region between an end of the channel layer and the substrate. The method also includes removing the substrate to expose the memory layer and exposing the core insulating layer by etching the exposed memory layer and the channel layer. The method additionally includes forming a first source layer and a buffer layer on an entire structure including the core insulating layer, and then performing a planarization process so that an uppermost surface becomes uniform. The method further includes forming a junction region by performing an ion implantation process on an upper end of the channel layer and performing a heat treatment process on the first source layer and the junction region after removing the buffer layer.

According to an embodiment of the present technology, during a process for connecting the channel layer and the source layer of a vertical channel structure, an opening may be formed by etching the channel layer, and the source layer may be filled in the opening to electrically connect the channel layer and the source layer. In addition, a junction region may be formed to have a uniform depth in the channel layer, by forming a buffer layer for an ion implantation process on the source layer and then performing the ion implantation process.

BRIEF DESCRIPTION OF THE DRAWINGS

FIGS. 5A to 5F, 6, 7, and 8A to 8F are cross-sectional views illustrating a method of manufacturing a semiconductor memory device according to an embodiment of the present disclosure.

DETAILED DESCRIPTION

Specific structural or functional descriptions of embodiments according to the concept of the present disclosure which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Hereinafter, embodiments of the present disclosure will be described with reference to the accompanying drawings in order to describe in detail enough to allow those of ordinary skill in the art to implement the technical idea of the present disclosure.

Figure 1:
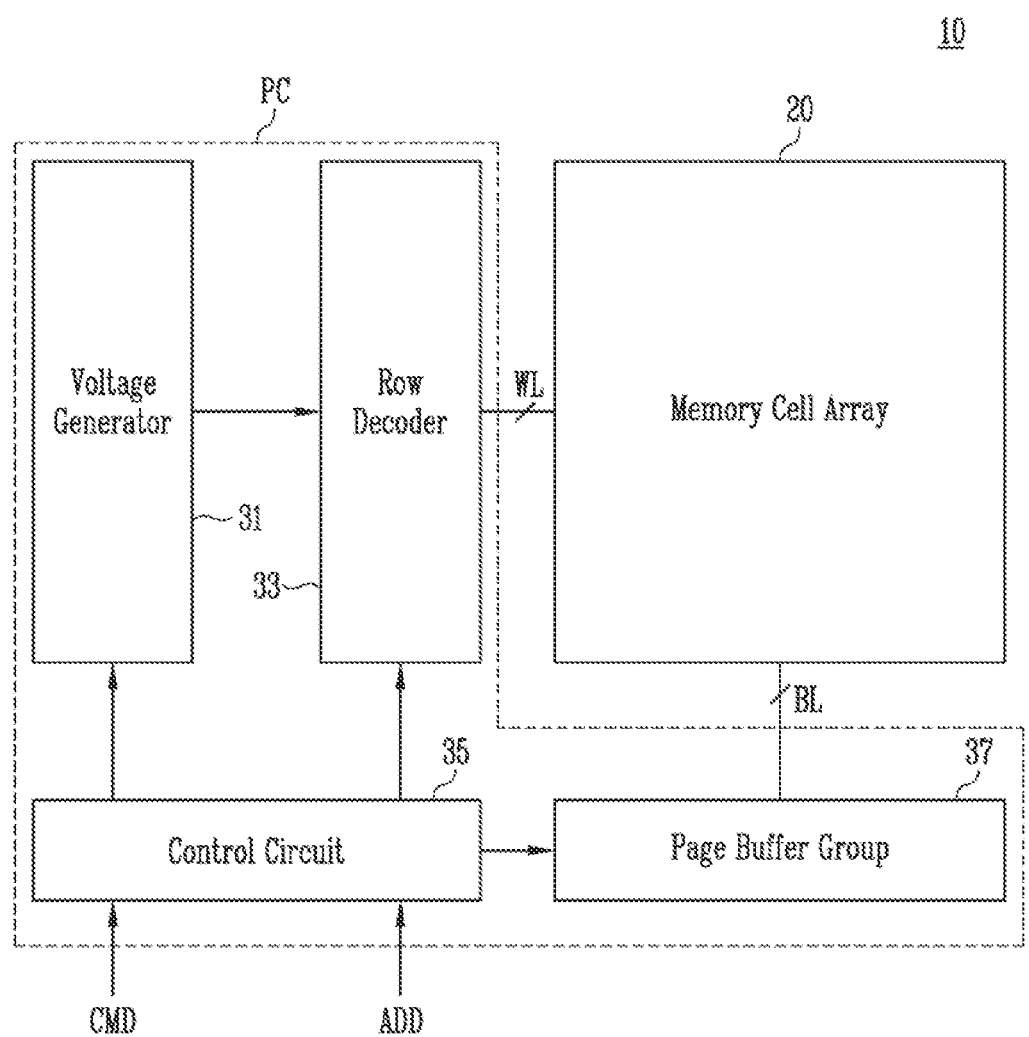
FIG. 1 is a block diagram illustrating a semiconductor memory device according to an embodiment of the present disclosure.

FIG. 1 is a block diagram illustrating a semiconductor memory device 10 according to an embodiment of the present disclosure.

Referring to FIG. 1, the semiconductor memory device 10 includes a peripheral circuit PC and a memory cell array 20.

The peripheral circuit PC may be configured to control a program operation for storing data in the memory cell array 20, a read operation for outputting data stored in the memory cell array 20, and an erase operation for erasing data stored in the memory cell array 20.

In an embodiment, the peripheral circuit PC may include a voltage generator 31, a row decoder 33, a control circuit 35, and a page buffer group 37.

The memory cell array 20 may include a plurality of memory blocks. The memory cell array 20 may be connected to the row decoder 33 through word lines WL, and may be connected to the page buffer group 37 through bit lines BL.

The control circuit 35 may control the voltage generator 31, the row decoder 33, and the page buffer group 37 in response to a command CMD and an address ADD.

The voltage generator 31 may generate various operation voltages such as an erase voltage, a ground voltage, a program voltage, a verify voltage, a pass voltage, and a read voltage used for the program operation, the read operation, and the erase operation in response to control of the control circuit 35.

The row decoder 33 may select a memory block in response to the control of the control circuit 35. The row decoder 33 may be configured to apply the operation voltages to the word lines WL connected to the selected memory block.

The page buffer group 37 may be connected to the memory cell array 20 through the bit lines BL. The page buffer group 37 may temporarily store data received from an input/output circuit (not shown) during the program operation in response to the control of the control circuit 35. The page buffer group 37 may sense a voltage or a current of the bit lines BL during the read operation or a verify operation in response to the control of the control circuit 35. The page buffer group 37 may select the bit lines BL in response to the control of the control circuit 35.

Structurally, the memory cell array 20 may overlap a portion of the peripheral circuit PC.

Figure 2:
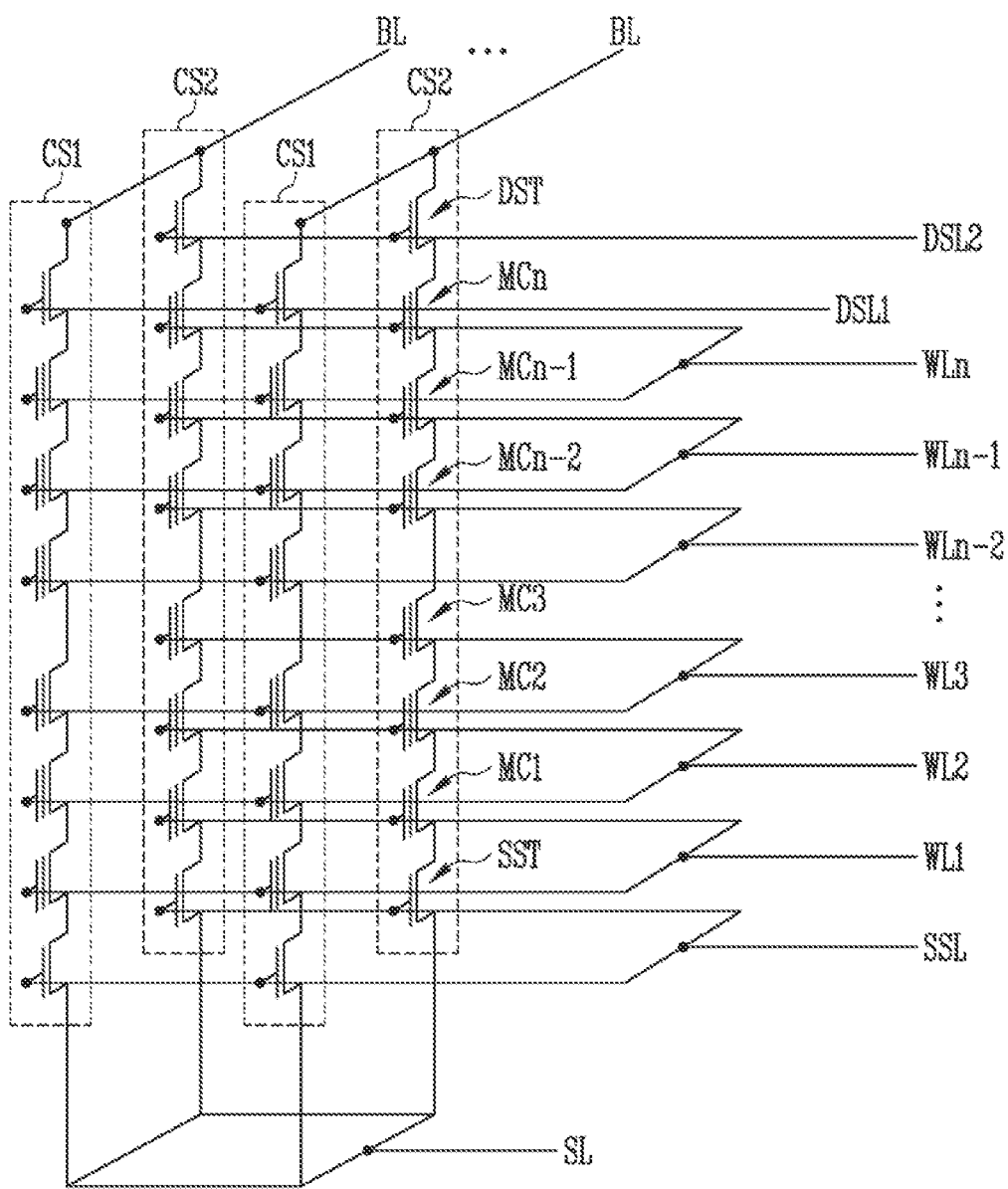
FIG. 2 is a circuit diagram illustrating a memory cell array of FIG. 1.

FIG. 2 is a circuit diagram illustrating the memory cell array 20 of FIG. 1.

Referring to FIG. 2, the memory cell array 20 may include a plurality of cell strings CS1 and CS2 connected between a source line SL and a plurality of bit lines BL. The plurality of cell strings CS1 and CS2 may be commonly connected to a plurality of word lines WL1 to WLn.

Each of the plurality of cell strings CS1 and CS2 may include at least one source select transistor SST connected to the source line SL, at least one drain select transistor DST connected to the bit line BL, and a plurality of memory cells MC1 to MCn connected in series between the source select transistor SST and the drain select transistor DST.

Gates of the plurality of memory cells MC1 to MCn may be respectively connected to the plurality of word lines WL1 to WLn that are spaced apart from each other and stacked. The plurality of word lines WL1 to WLn may be disposed between a source select line SSL and two or more drain select lines DSL1 and DSL2. The two or more drain select lines DSL1 and DSL2 may be spaced apart from each other at the same level.

A gate of the source select transistor SST may be connected to the source select line SSL. A gate of the drain select transistor DST may be connected to a drain select line corresponding to the gate of the drain select transistor DST.

The source line SL may be connected to a source of the source select transistor SST. A drain of the drain select transistor DST may be connected to a bit line corresponding to the drain of the drain select transistor DST.

The plurality of cell strings CS1 and CS2 may be divided into string groups respectively connected to the two or more drain select lines DSL1 and DSL2. Cell strings connected to the same bit line may be independently controlled by different drain select lines. In addition, cell strings connected to the same drain select line may be independently controlled by different bit lines.

In an embodiment, the two or more drain select lines DSL1 and DSL2 may include a first drain select line DSL1 and a second drain select line DSL2. The plurality of cell strings CS1 and CS2 may include a first cell string CS1 of a first string group connected to the first drain select line DSL1 and a second string CS2 of a second string group connected to the second drain select line DSL2.

Figure 3:
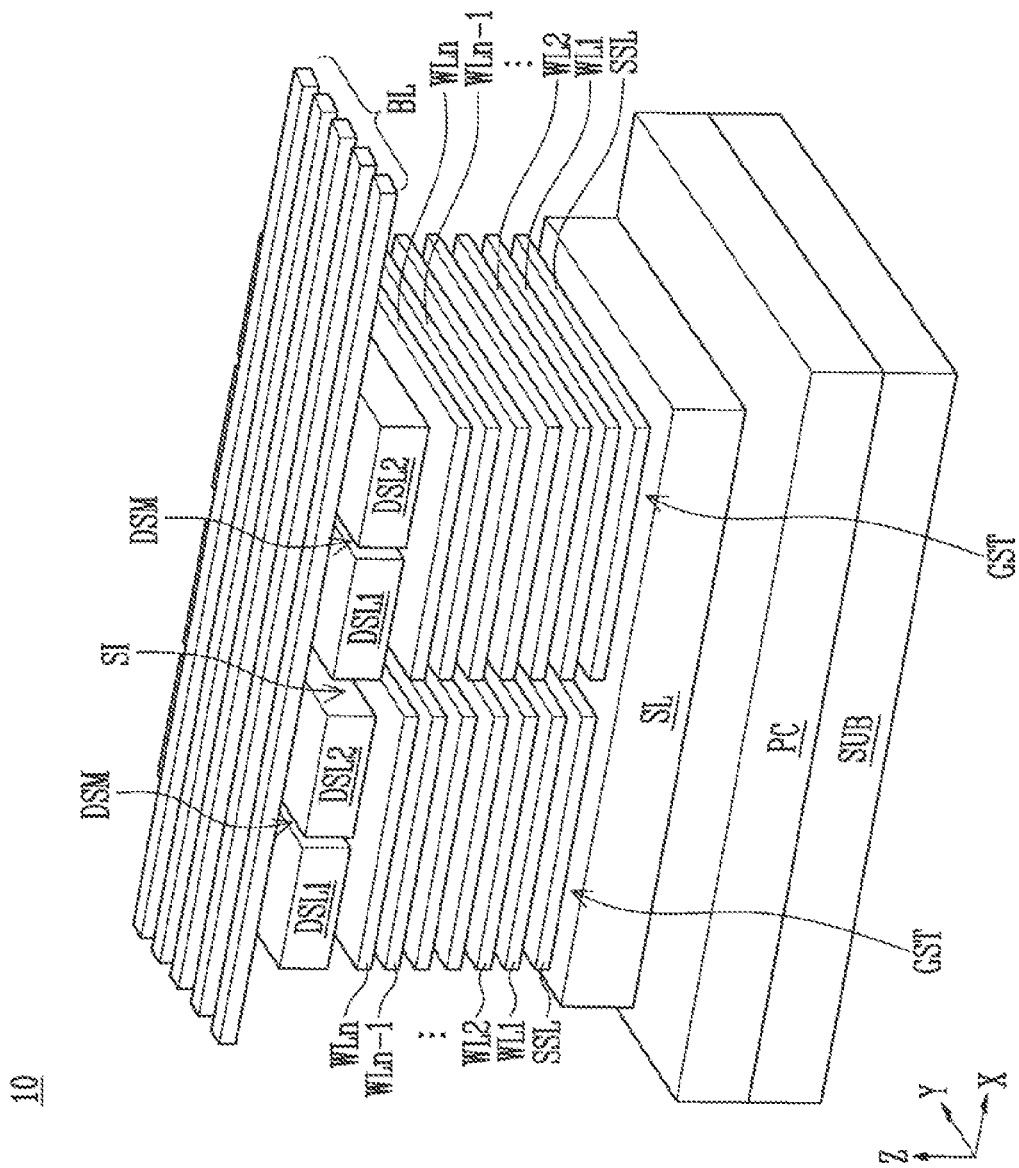
FIG. 3 is a perspective view illustrating a semiconductor memory device according to embodiments of the present disclosure.

FIG. 3 is a perspective view schematically illustrating the semiconductor memory device 10 according to embodiments of the present disclosure.

Referring to FIG. 3, the semiconductor memory device 10 may include the peripheral circuit PC disposed on a substrate SUB and gate stacks GST overlapping the peripheral circuit PC.

Each of the gate stacks GST may include the source select line SSL, the plurality of word lines WL1 to WLn, and the two or more drain select lines DSL1 and DSL2 separated from each other at the same level by a separation structure DSM.

The source select line SSL and the plurality of word lines WL1 to WLn may extend in a first direction X and a second direction Y, and may be formed in a flat plate shape parallel to an upper surface of the substrate SUB. The first direction X may be a direction in which an X-axis of an XYZ Cartesian coordinate system is directed, and the second direction Y may be a direction in which a Y-axis of the XYZ Cartesian coordinate system is directed.

The plurality of word lines WL1 to WLn may be spaced apart from each other and stacked in a third direction Z. The third direction Z may be a direction in which a Z-axis of the XYZ Cartesian coordinate system is directed. The plurality of word lines WL1 to WLn may be disposed between the two or more drain select lines DSL1 and DSL2 and the source select line SSL.

The gate stacks GST may be separated from each other by a slit SI. The separation structure DSM may be formed shorter in the third direction Z than the slit SI and may overlap the plurality of word lines WL1 to WLn.

Each of the separation structure DSM and the slit SI may extend in a straight line shape, a zigzag shape, or a wave shape. Widths of each of the separation structure DSM and the slit SI may be variously changed according to a design rule.

The source select line SSL according to an embodiment may be disposed closer to the peripheral circuit PC than the two or more drain select lines DSL1 and DSL2.

The semiconductor memory device 10 may include the source line SL disposed between the gate stacks GST and the peripheral circuit PC, with the plurality of bit lines BL spaced farther from the peripheral circuit PC than the source line SL. The gate stacks GST may be disposed between the plurality of bit lines BL and the source line SL.

Figure 4:
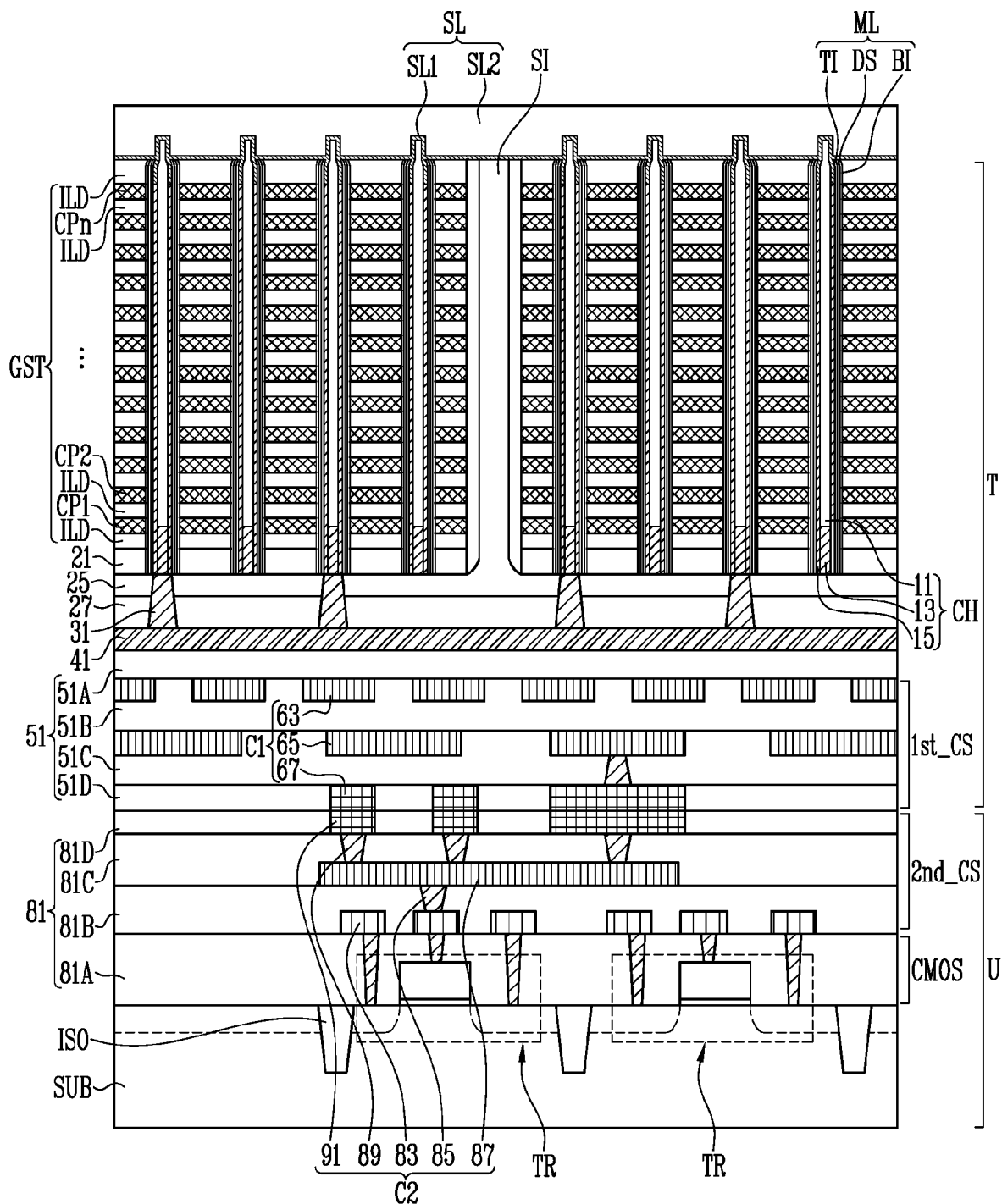
FIG. 4 is a cross-sectional view illustrating the memory cell array of FIG. 1.

FIG. 4 is a cross-sectional view illustrating the memory cell array 20 of FIG. 1.

Referring to FIG. 4, in the memory cell array 20, a lower structure U and an upper structure T may be bonded to each other, and a source line structure SL may be disposed on the upper structure T.

The upper structure T may include gate stacks GST separated by a slit SI, channel structures CH passing through the gate stacks GST, a memory layer ML extending along sidewalls of each of the channel structures CH, a bit line 41 disposed under the gate stack GST, and a first connection structure C1.

The gate stack GST may include interlayer insulating layers ILD and conductive patterns CP1 to CPn alternately stacked in a vertical direction. Each of the conductive patterns CP1 to CPn may include various conductive materials such as a doped silicon layer, a metal layer, a metal silicide layer, and a barrier layer, and may include two or more types of conductive materials. For example, each of the conductive patterns CP1 to CPn may include tungsten and a titanium nitride layer (TiN) surrounding a surface of the tungsten. The tungsten is a low-resistance metal and may lower a resistance of the conductive patterns CP1 to CPn. The titanium nitride layer TiN may be a barrier layer and may prevent direct contact between the tungsten and the interlayer insulating layers ILD.

Among the conductive patterns CP1 to CPn, the first conductive pattern CP1 adjacent to the bit line 41 may be used as a drain select line DSL. In another embodiment, two or more conductive patterns adjacent to the bit line 41 and successively stacked may be used as drain select lines. Among the conductive patterns CP1 to CPn, the n-th conductive pattern CPn adjacent to first and second source layers SL1 and SL2 may be used as the source select line SSL. In another embodiment, two or more conductive patterns adjacent to the first and second source layers SL1 and SL2 and sequentially stacked may be used as source select lines. The conductive patterns (for example, CP2 to CPn−1) adjacent to each other in the vertical direction and disposed between the drain select line and the source select line may be used as the word lines WL1 to WLn described above with reference to FIG. 2.

The channel structure CH may pass through the gate stack GST in the vertical direction, and one end of the channel structure CH may be formed to protrude beyond the top of the gate stack GST. The channel structure CH may be formed as a hollow type. The channel structure CH may include a core insulating layer 11 filling a central region of the channel structure CH, a doped semiconductor layer 13 positioned at a lower end of the core insulating layer 11, and a channel layer 15 surrounding a surface of the core insulating layer 11 and the doped semiconductor layer 13. The channel layer 15 is used as a channel region of a cell string corresponding thereto. The channel layer 15 may be formed of a semiconductor material. In an embodiment, the channel layer 15 may include a silicon layer. A dopant may be implanted into the uppermost portion of the channel layer 15, that is, a portion of the channel layer corresponding to the source select transistor by an ion implantation process. The channel structure CH may be formed to protrude beyond the interlayer insulating layer ILD disposed on the uppermost portion of the gate stack GST. An end of the channel structure CH that protrudes beyond the interlayer insulating layer ILD disposed on the uppermost portion of the gate stack GST may be formed of only the core insulating layer 11. For example, the channel layer 15 may be formed to have a height lower than the interlayer insulating layer ILD disposed on the uppermost portion of the gate stack GST. For example, the channel layer 15 may be formed to have a height lower than the interlayer insulating layer ILD disposed on the uppermost portion of the gate stack GST and equal to or higher than the conductive patterns used as the source select lines.

The memory layer ML may be formed to surround a surface of the channel structure CH. The memory layer ML may include a tunnel insulating layer TI surrounding the channel layer 15 of the channel structure CH, a data storage layer DS surrounding the tunnel insulating layer TI, and a blocking insulating layer BI surrounding the data storage layer DS. The memory layer ML may extend in a vertical direction, and may extend to be longer than the channel layer 15. That is, the memory layer ML may be formed to have a height higher than the channel layer 15. That is, the channel layer 15 may be disposed between the memory layer ML and the core insulating layer 11, and may have a height lower than the memory layer ML and the core insulating layer 11. Accordingly, an opening may be formed at the uppermost portion of the memory layer ML and the core insulating layer 11 by the height of the channel layer 15, and the first source layer SL1 may be filled in the opening. The memory layer ML may be formed to have the same height as the interlayer insulating layer ILD disposed on the uppermost portion of the gate stack GST. The memory layer ML may be defined as a component included in the channel structure CH.

The bit line 41 may be disposed under the gate stack GST. The bit line 41 may be connected to the channel structure CH through contact plugs 31 passing through a plurality of insulating layers 21, 25, and 27. The bit line 41 may be spaced apart from the substrate SUB by a first insulating structure 51 and a second insulating structure 81.

A first connection structure 1st_CS may include the first insulating structure 51 and the first connection structures C1 formed inside the first insulating structure 51. The first connection structures C1 may include various conductive patterns 63, 65, and 67. The first insulating structure 51 may include two or more insulating layers 51A to 51D stacked between the bit line 41 and the second insulating structure 81.

The lower structure U may include a complementary metal oxide semiconductor (CMOS) circuit structure CMOS including a plurality of transistors TR and element isolation layers ISO formed on the substrate SUB, and a second connection structure 2nd_CS formed on the CMOS circuit structure CMOS. The element isolation layers ISO may include an insulating material buried in the substrate SUB.

The second connection structure 2nd_CS may include the second insulating structure 81 formed on the substrate SUB and second connection structures C2 formed inside the second insulating structure 81. Each of the second connection structures C2 may include various conductive patterns 83, 85, 87, 89, and 91 buried in the second insulating structure 81. The second insulating structure 81 may include two or more insulating layers 81A to 81D sequentially stacked.

The upper structure T and the lower structure U may be bonded to each other by a bonding process. For example, the exposed conductive patterns 67 of the first connection structure 1nd_CS of the upper structure T and the exposed conductive patterns 91 of the second connection structure 2nd_CS of the lower structure U may be disposed to face each other and may be adhered to each other. The conductive patterns 67 and the conductive patterns 91 may be defined as bonding metals.

The source line structure SL may be disposed on the upper structure T. The source line structure SL may include the first source layer SL1 and the second source layer SL2. The first source layer SL1 may be formed of a dopant polysilicon layer. The first source layer SL1 may be formed along surfaces of the interlayer insulating layer ILD disposed on the uppermost portion, the memory layer ML, and the core insulating layer 11. The first source layer SL1 may be formed to fill an opening between an upper portion of the memory layer ML and an upper portion of the core insulating layer 11 formed by the height of the channel layer 15. The first source layer SL1 may be formed to be in contact with the uppermost end surface of the channel layer 15. The second source layer SL2 may be formed on the first source layer SL1 and may be formed of a metal material having a low electrical resistance. For example, the second source layer SL2 may be formed of titanium nitride (TiN) or tungsten (W) to reduce a resistance of the source line structure. In addition, the second source layer SL2 may be formed using copper (Cu), and may further include tantalum (Ta) or tantalum nitride (TaN) as a barrier layer on an upper surface and a lower surface of the second source layer SL2.

The source line structure SL may be used as the source line SL of FIG. 2.

FIGS. 5A to 5F, 6, 7, and 8A to 8F are cross-sectional views illustrating a method of manufacturing a semiconductor memory device according to an embodiment of the present disclosure.

FIGS. 5A to 5F are cross-sectional views illustrating a step of forming a memory cell array, a first line array, and first connection structures on a first substrate.

Figure 5A:

Referring to FIG. 5A, first material layers 111 and second material layers 113 may be alternately stacked layer by layer on the first substrate 101.

The first substrate 101 may be formed of a material having an etching rate different from that of the first material layers 111 and the second material layers 113. For example, the substrate 101 may include silicon.

In an embodiment, the first material layers 111 may be an insulating material for the interlayer insulating layers ILD described above with reference to FIG. 4. The second material layers 113 may be formed of a material having an etching rate different from that of the first material layers 111. For example, the first material layers 111 may include silicon oxide, and the second material layers 113 may include silicon nitride. The following drawings show an embodiment in which the first material layers 111 are formed of an insulating material and the second material layers 113 are formed of sacrificial layers, but the present disclosure is not limited thereto. Physical properties of the first material layers 111 and the second material layers 113 may be variously changed. For example, the first material layers 111 may be an insulating material for the interlayer insulating layers ILD described above with reference to FIG. 4, and the second material layers 113 may be a conductive material for the conductive patterns CP1 to CPn described above with reference to FIG. 4.

Figure 5B:
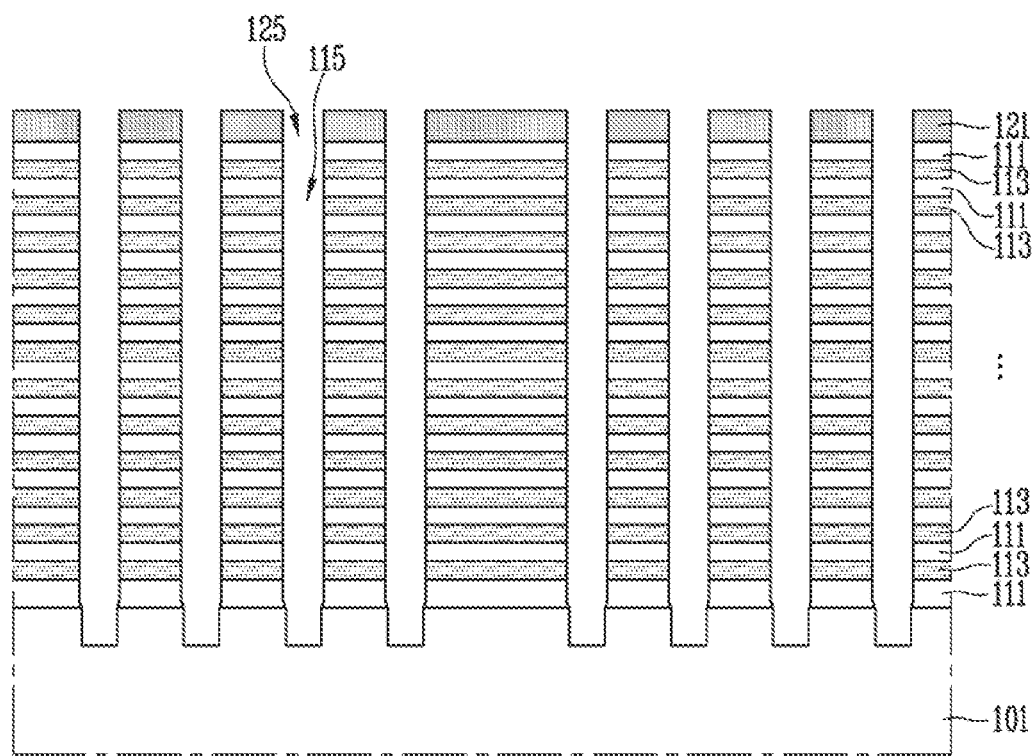

Referring to FIG. 5B, a first mask pattern 121 including a first opening 125 may be formed on the stack structure of the first material layers 111 and the second material layers 113. Thereafter, channel holes 115 passing through the first material layers 111 and the second material layers 113 may be formed through the first opening 125 of the first mask pattern 121. The channel holes 115 may extend inward to a partial depth of the first substrate 101. According to an etchant used to form the channel holes 115, the channel holes 115 may be formed in various shapes.

In an embodiment, the channel holes 115 may be formed using a first etchant. An etching speed of the first material layers 111 and the second material layers 113 with respect to the first etchant may be faster than an etching speed of the first substrate 101 with respect to the first etchant. As a result, a width of an end of the channel holes 115 extending into the first substrate 101 may be formed to be narrower than a width of the channel hole 115 passing through the first material layers 111 and the second material layers 113.

Figure 5C:
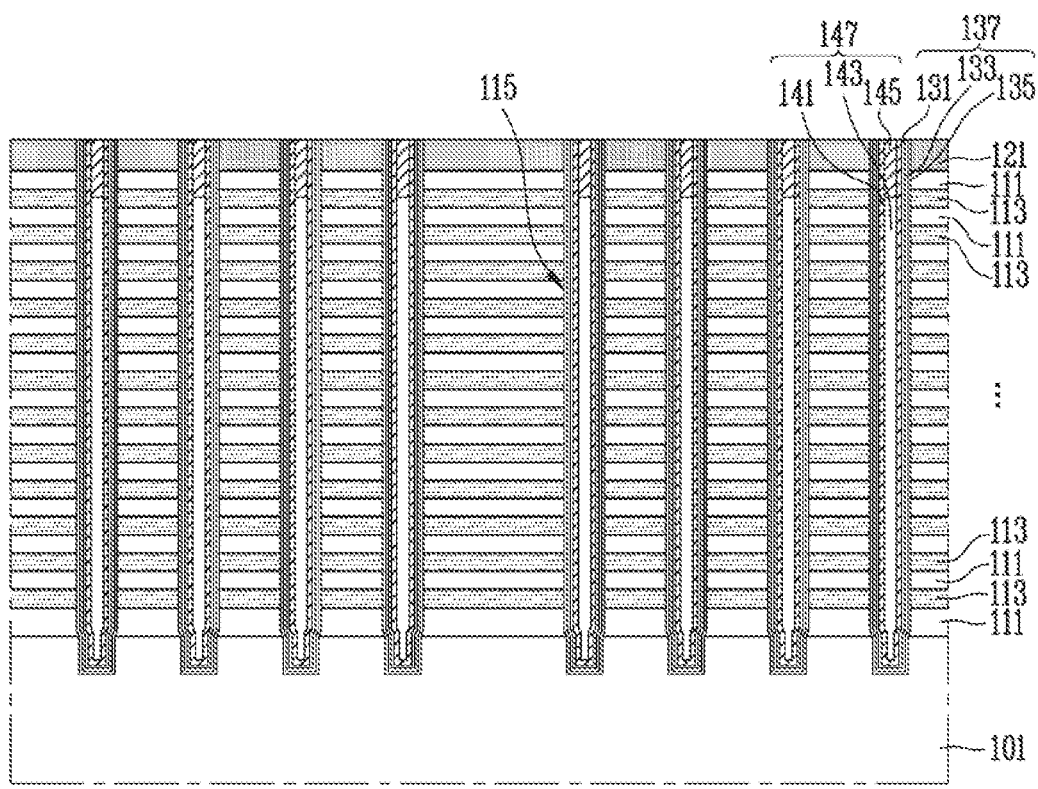

Referring to FIG. 5C, a memory layer 137 and a channel structure 147 may be formed in the channel holes 115. A sidewall of the channel structure 147 and an end of the channel structure 147 extending into the first substrate 101 may be surrounded by the memory layer 137.

Forming the memory layer 137 may include sequentially stacking a blocking insulating layer 135, a data storage layer 133, and a tunnel insulating layer 131 on a surface of the channel holes 115. The blocking insulating layer 135, the data storage layer 133, and the tunnel insulating layer 131 may include the same materials as the blocking insulating layer BI, the data storage layer DS, and the tunnel insulating layer TI described above with reference to FIG. 4. The memory layer 137 may be formed in a liner shape, and a central region of the channel holes 115 may be defined by the memory layer 137.

Thereafter, the channel layer 141 may be formed on a surface of the memory layer 137 to form the channel structure 147. The channel layer 141 may include a semiconductor layer used as a channel region. For example, the channel layer 141 may include undoped polysilicon.

In an embodiment, the channel layer 141 may be formed in a liner shape, and the central region of the channel holes 115 may include a portion that is not filled with the channel layer 141. When the channel layer 141 is formed in the liner shape, forming the channel structure 147 may include filling the central region of the channel holes 115 on the channel layer 141 with a core insulating layer 143, etching a portion of the core insulating layer 143 to define a recess region in a portion of the central region of the channel holes 115, and filling the recess region with a doped semiconductor layer 145. The core insulating layer 143 may include an oxide, and the doped semiconductor layer 145 may include a conductive dopant. The conductive dopant may include an n-type dopant for a junction. The conductive dopant may include a counter doped p-type dopant.

In another embodiment, the channel layer 141 may be formed to fill the central region of the channel holes 115, and the core insulating layer 143 and the doped semiconductor layer 145 may be omitted. When the core insulating layer 143 and the doped semiconductor layer 145 are omitted, forming the channel structure 147 may further include doping a conductive dopant into the channel layer 141.

Figure 5D:
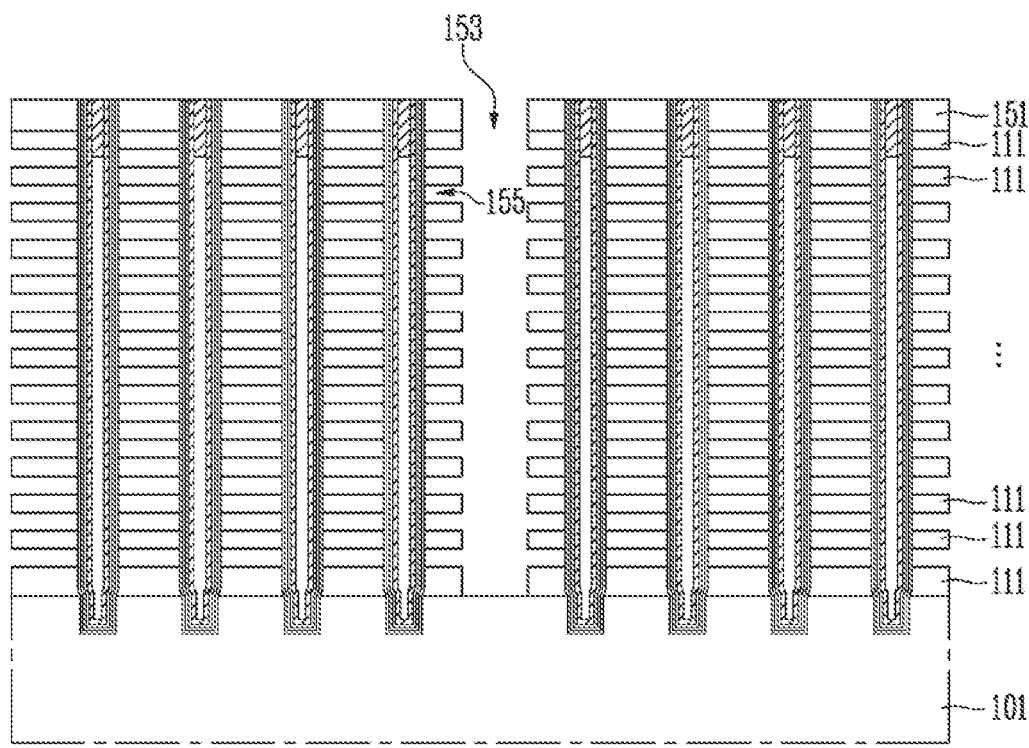

Referring to FIG. 5D, after the first mask pattern 121 shown in FIG. 5C is removed, the first insulating layer 151 may be formed.

Subsequently, a slit 153 may be formed. The slit 153 may pass through the first insulating layer 151 and pass through the stack structure of the first material layers 111 and the second material layers 113. The slit 153 may correspond to the slit SI shown in FIG. 4. Subsequently, horizontal spaces 155 may be defined by selectively removing the second material layers 113 exposed through the slit 153. The horizontal spaces 155 may be defined between the first material layers 111 adjacent in the vertical direction.

Figure 5E:
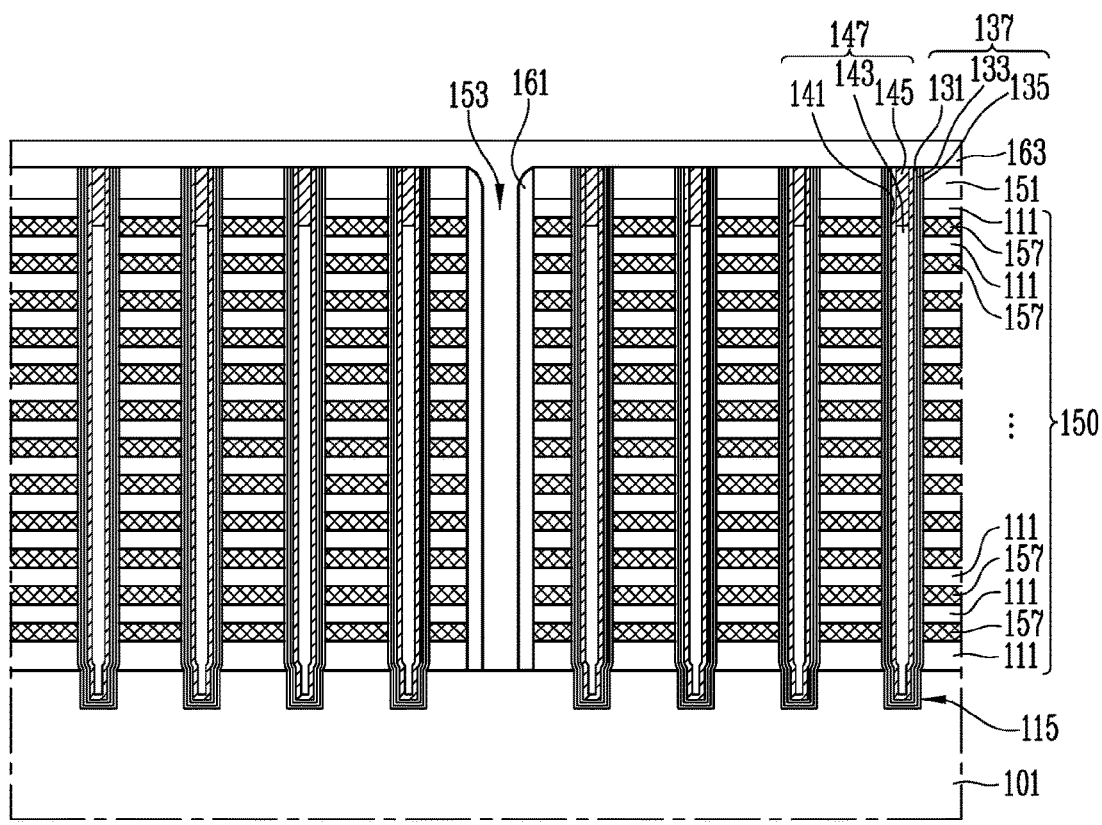

Referring to FIG. 5E, the horizontal spaces 155 shown in FIG. 5D are respectively filled with third material layers 157 through the slit 153. The third material layers 157 may be the conductive patterns CP1 to CPn described above with reference to FIG. 4. The third material layers 157 may fill the horizontal spaces 155 to surround the channel structure 147 and the memory layer 137.

As described above, the gate stack 150 may be formed on the first substrate 101 by replacing the second material layers 113 as sacrificial layers with the third material layers 157 as conductive patterns. The gate stack 150 may include a structure in which the first material layers 111 as interlayer insulating layers and the third material layers 157 as conductive patterns are alternately stacked. The channel structure 147 may pass through the gate stack 150 and extend into the first substrate 101. The memory layer 137 may extend from a region between the channel structure 147 and the gate stack 150 to a region between the end of the channel structure 147 and the first substrate 101.

The memory block including the plurality of cell strings CS1 and CS2 described above with reference to FIG. 2 may be formed on the first substrate 101 by the processes described above with reference to FIGS. 5A to 5E. Each of the cell strings may include the drain select transistor DST and the memory cells MC1 to MCn connected in series, as described above with reference to FIG. 3. The drain select transistor DST and the memory cells MC1 to MCn described above with reference to FIG. 3 may be defined at intersections of the channel structure 147 shown in FIG. 5E and the third material layers 157 as conductive patterns, and may be connected in series by the channel structure 147.

Subsequently, a sidewall insulating layer 161 may be formed to cover a sidewall of the gate stack 150. Thereafter, a second insulating layer 163 extending to fill an inside of the slit 153 and cover the sidewall insulating layer 161 and the first insulating layer 151 may be formed.

Figure 5F:
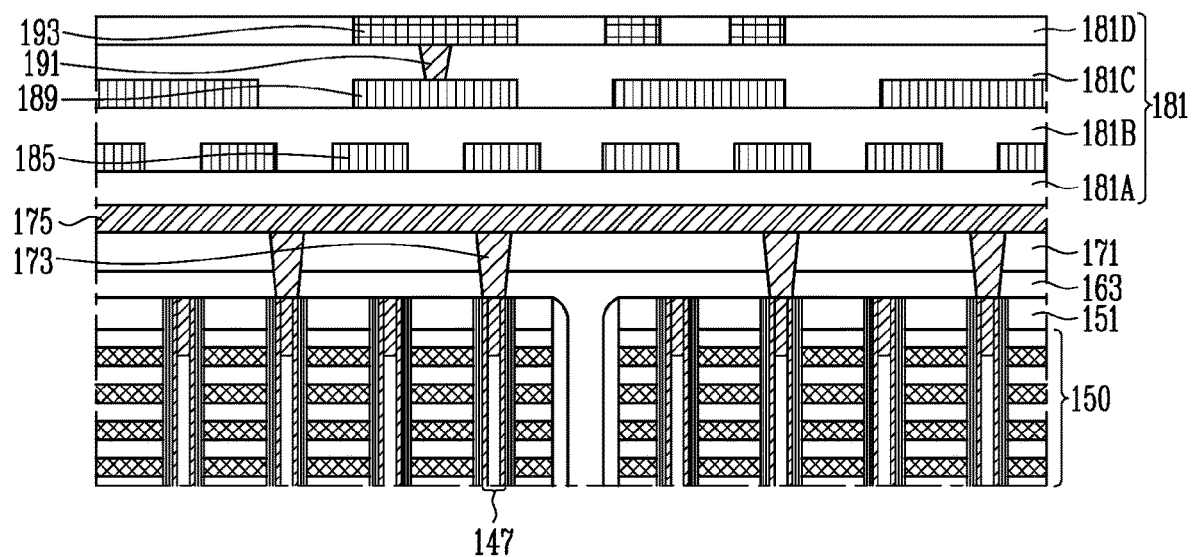

Referring to FIG. 5F, a third insulating layer 171 may be formed on the second insulating layer 163. Subsequently, contact plugs 173 passing through the third insulating layer 171 or passing through the third insulating layer 171 and the second insulating layer 163 may be formed. The contact plugs 173 may extend to be in contact with the channel structure 147.

Subsequently, the first line array 175 may be formed. The first line array 175 may be a bit line connected to the contact plug 173. Thereafter, a first insulating structure 181 covering the first line array 175 may be formed. The first insulating structure 181 may include two or more insulating layers 181A, 181B, 181C, and 181D. First connection structures 185, 189, 191, and 193 may be buried in the first insulating structure 181, and the first connection structures 185, 189, 191 and 193 may be electrically connected through contact plugs (not shown).

The first connection structures 185, 189, 191, and 193 may include a first bonding metal having a surface exposed to an outside of the first insulating structure 181.

Figure 6:
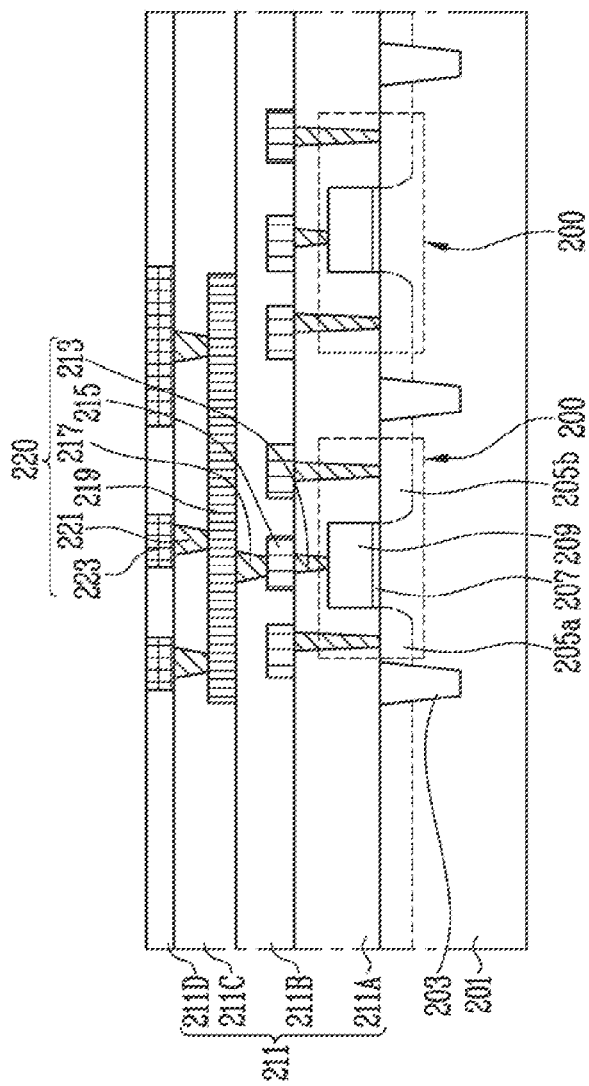

FIG. 6 is a cross-sectional view illustrating a step of forming the CMOS circuit and the second connection structures on a second substrate.

Referring to FIG. 6, the method may include forming a plurality of transistors 200 configuring the CMOS circuit on the second substrate 201.

The second substrate 201 may be a bulk silicon substrate, a silicon-on-insulator substrate, a germanium substrate, a germanium-on-insulator substrate, a silicon-germanium substrate, or an epitaxial layer formed through a selective epitaxial growth method.

Each of the transistors 200 may be formed in an active region of the second substrate 201 partitioned by an isolation layer 203. Each of the transistors 200 may include a gate insulating layer 207 and a gate electrode 209 stacked on an active region corresponding thereto, and junctions 205a and 205b formed in the active region on both sides of the gate electrode 209. The junctions 205a and 205b may include a conductive dopant for implementing a transistor corresponding thereto. The junctions 205a and 205b may include at least one of an n-type dopant and a p-type dopant.

After forming the plurality of transistors 200, second connection structures 220 connected to the transistors 200 configuring the CMOS circuit, and second insulating structures 211 covering the second connection structures 220 and the transistors 200, may be formed.

The second insulating structure 211 may include two or more insulating layers 211A, 211B, 211C, and 211D. The second connection structures 220 may be buried in the second insulating structure 211. Each of the second connection structures 220 may include a plurality of conductive patterns 213, 215, 217, 219, 221, and 223. The second insulating structure 211 and the second connection structures 220 are not limited to the example shown in the drawing and may be variously changed.

The conductive patterns 213, 215, 217, 219, 221, and 223 represent the second connection structures 220 and may include a second bonding metal having a surface exposed to an outside of the second insulating structure 211.

Figure 7:
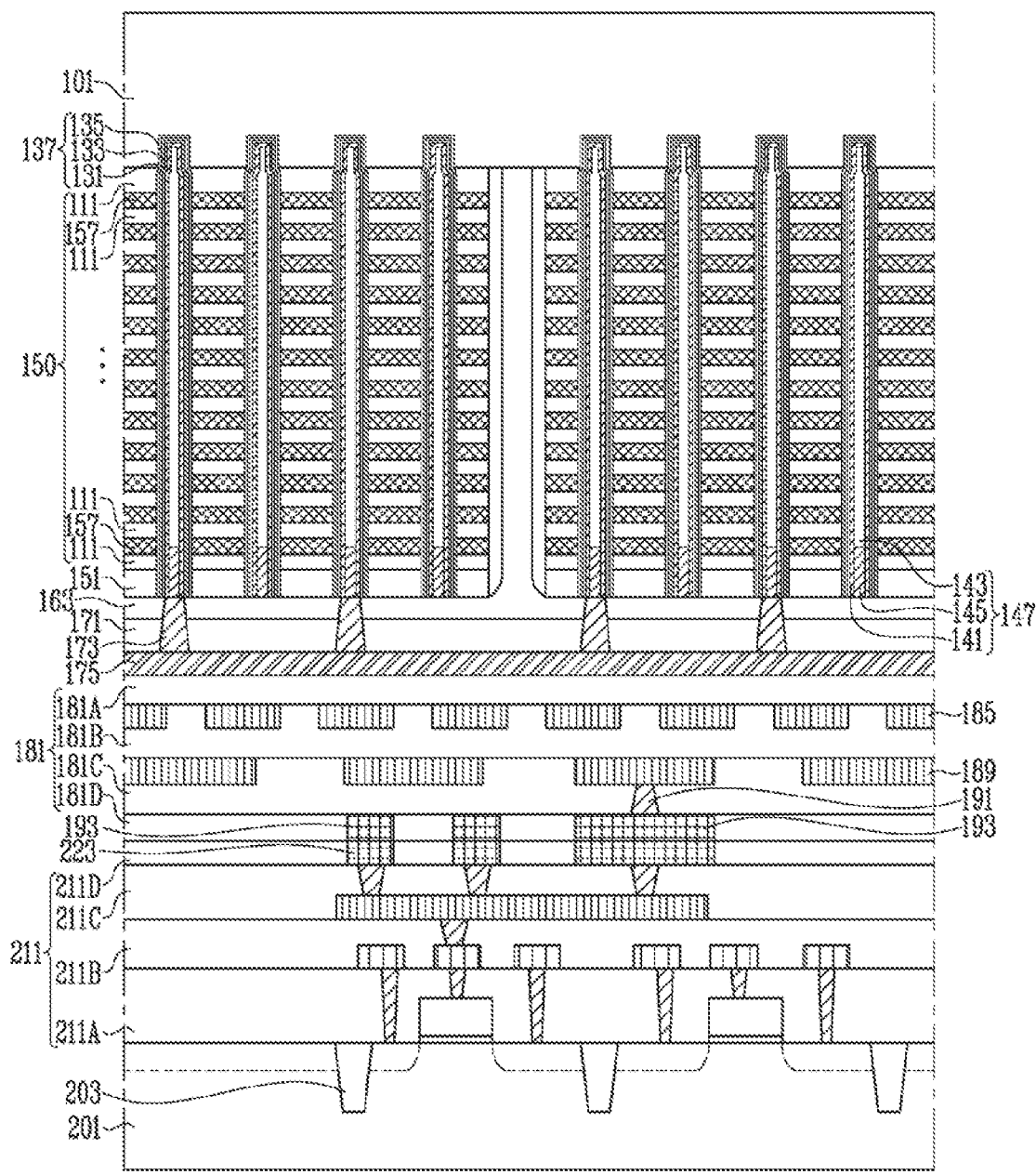

FIG. 7 is a cross-sectional view illustrating a step of bonding the first connection structures and the second connection structures to each other.

Referring to FIG. 7, the first substrate 101 and the second substrate 201 are aligned so that a first bonding metal of the first connection structure 193 on the first substrate 101 and a second bonding metal of the second connection structure 223 on the second substrate 201 may be in contact with each other. The first bonding metal and the second bonding metal may include various metals, and may include, for example, copper.

Thereafter, the first bonding metal of the first connection structure 193 and the second bonding metal of the second connection structure 223 are adhered to each other. To this end, after heat is applied to the first bonding metal and the second bonding metal, the first bonding metal and the second bonding metal may be hardened. The present disclosure is not limited thereto, and various processes for connecting the first connection structure 193 and the second connection structure 223 may be introduced.

FIGS. 8A to 8F are cross-sectional views illustrating forming the source line structure connected to the plurality of cell strings on the gate stack 150.

Figure 8A:
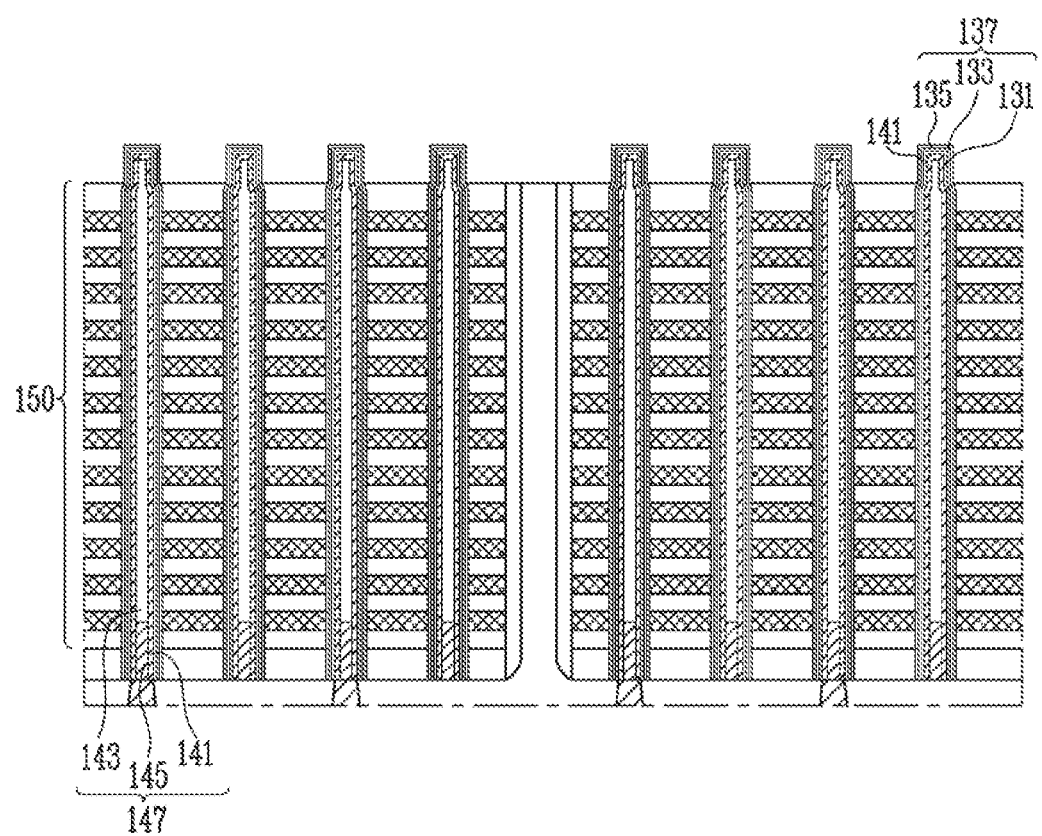

Referring to FIG. 8A, the first substrate 101 shown in FIG. 7 may be removed. When the first substrate 101 is removed, the memory layer 137 may serve as an etch stop layer. Accordingly, the channel structure 147, which protrudes beyond the gate stack 150, may be protected by the memory layer 137.

Figure 8B:
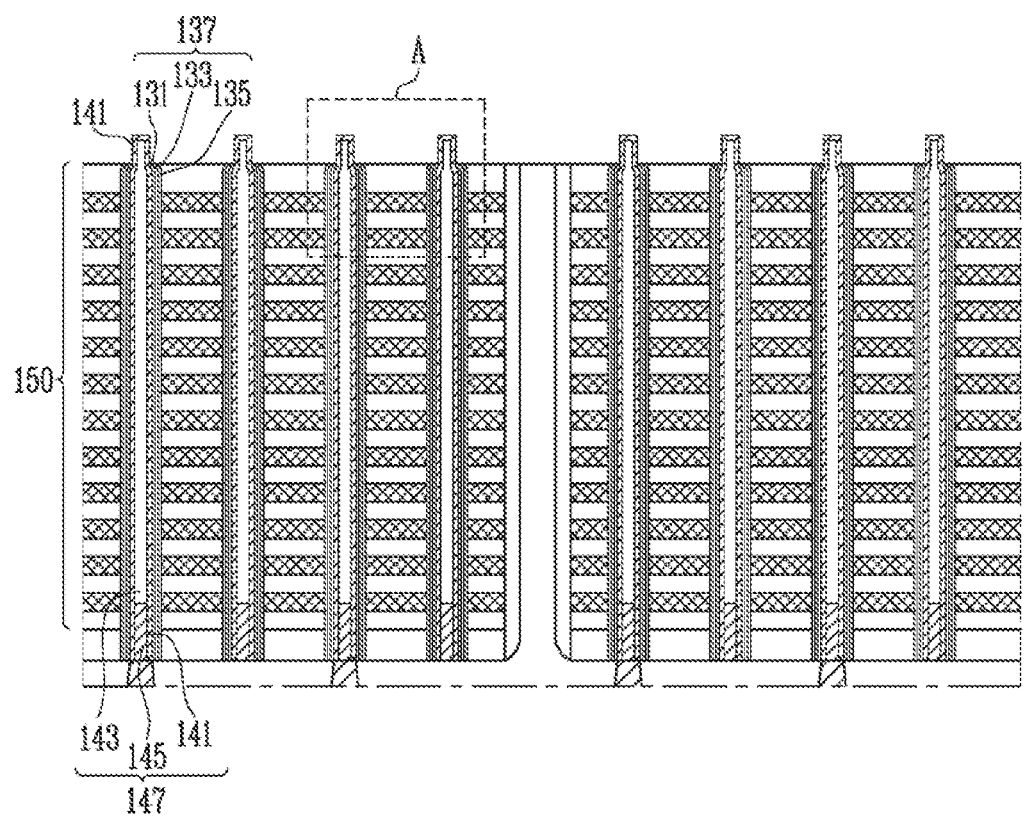

Referring to FIG. 8B, the memory layer 137 protruding above the gate stack 150 may be removed to expose the channel layer 141. The exposed channel layer 141 may protrude above the gate stack 150. An upper surface height of the memory layer 137 may be equal to or lower than an upper surface height of the gate stack 150.

Thereafter, process steps are described with reference to an enlarged view of an area A indicated in FIG. 8B.

Figure 8C:
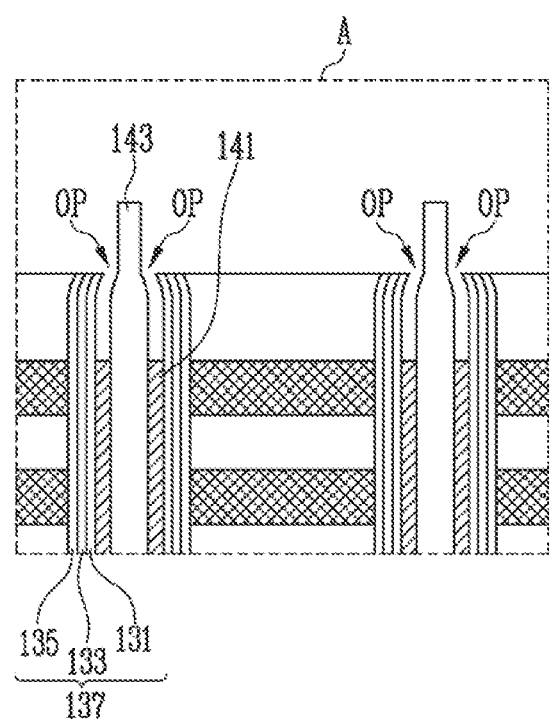

Referring to FIG. 8C, the channel layer 141, exposed by etching the memory layer 137, is etched to expose a protrusion of the core insulating layer 143. At this time, an opening OP is formed by etching an upper end of the channel layer between the tunnel insulating layer 131 and the core insulating layer 143 by controlling an etching process. That is, the etching process may be performed to etch the exposed channel layer 141, and the channel layer 141 may be etched so that a height of the channel layer 141 is similar to that of the conductive pattern used as the source select line positioned at the uppermost portion.

Figure 8D:
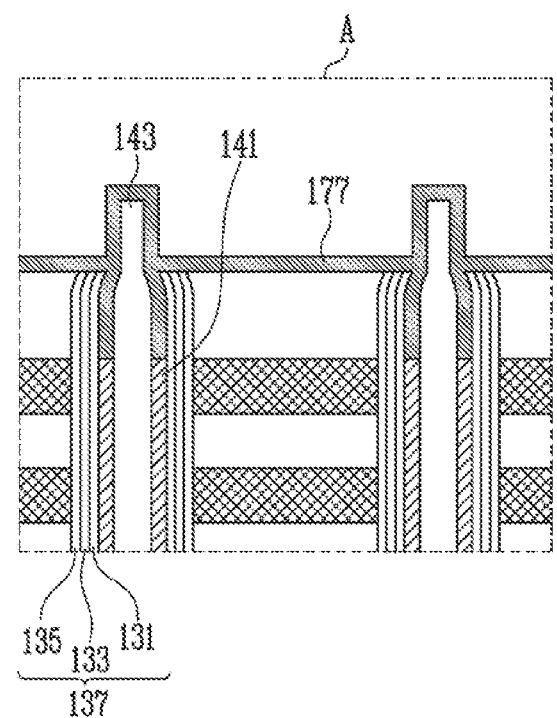

Referring to FIG. 8D, the first source layer 177 is formed along an upper surface of the entire structure including the exposed surface of the core insulating layer 143. At this time, the first source layer 177 is formed to fill the opening OP shown in FIG. 8C. Accordingly, the first source layer 177 is directly in contact with the uppermost portion of the channel layer 141. The first source layer 177 may be formed of a doped polysilicon layer.

Figure 8E:
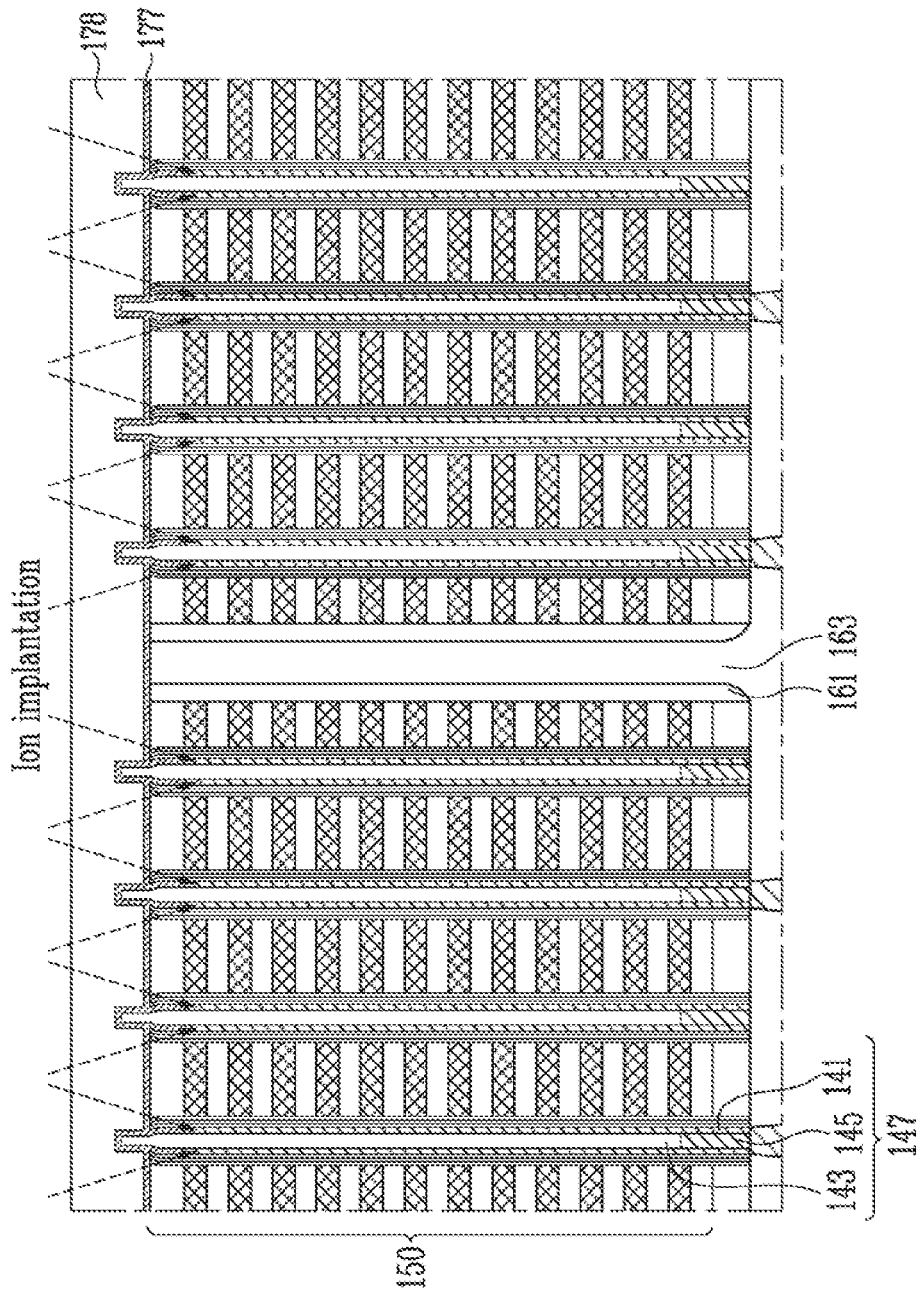

Referring to FIG. 8E, the buffer layer 178 is formed on the first source layer 177, and a planarization process is performed so that an upper height of the buffer layer 178 is uniform. The buffer layer 178 may be formed of an oxide layer.

Thereafter, an ion implantation process is performed to implant a dopant into the channel layer 141 used as a channel of the source select transistor to form a junction region. Because an ion implantation depth becomes uniform by the buffer layer 178 during the ion implantation process, an ion implantation region may be controlled.

Referring to FIG. 8F, after the buffer layer 178 shown in FIG. 8E is removed, a local heat treatment process using a laser is performed to activate the junction region. A target region of the heat treatment process may include the junction region into which the dopant is implanted among the first source layer 177 and the channel layer 141.

Thereafter, the second source layer 179 is formed on the first source layer 177. The second source layer 179 may be formed on the first source layer 177, and may be formed of a metal material having a low electrical resistance. For example, the second source layer 179 may be formed of titanium nitride (TiN) or tungsten (W) to reduce the electrical resistance of the source line structure. In addition, the second source layer 179 may be formed using copper (Cu), and may further include tantalum (Ta) or tantalum nitride (TaN) as a barrier layer on the upper surface and the lower surface of the second source layer 179.

As described above, according to an embodiment of the present disclosure, after forming the opening by etching the channel layer, the opening may be filled with the first source layer to directly connect the channel layer and the source layer. In addition, after forming the buffer layer, the ion implantation process may be performed to uniformly form the junction region. In addition, the junction region may be activated by performing a local heat treatment process using a laser.

Figure 9:
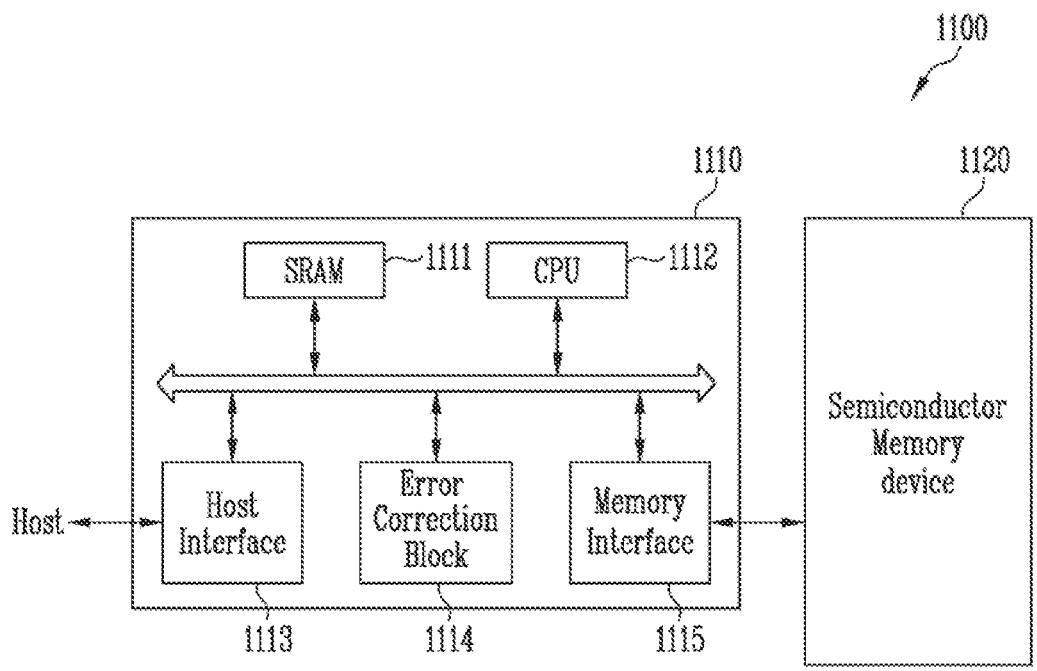
FIG. 9 is a block diagram illustrating a configuration of a memory system according to an embodiment of the present disclosure.

FIG. 9 is a block diagram illustrating a configuration of a memory system 1100 according to an embodiment of the present disclosure.

Referring to FIG. 9, the memory system 1100 includes a semiconductor memory device 1120 and a memory controller 1110.

The semiconductor memory device 1120 may be a multi-chip package configured of a plurality of flash memory chips. The semiconductor memory device 1120 may be the semiconductor memory device described with reference to FIGS. 1 to 4.

The memory controller 1110 may be configured to control the semiconductor memory device 1120, and may include static random access memory (SRAM) 1111, a central processing unit (CPU) 1112, a host interface 1113, an error correction block 1114, and a memory interface 1115. The SRAM 1111 is used as an operation memory of the CPU 1112, the CPU 1112 performs an overall control operation for data exchange of the memory controller 1110, and the host interface 1113 includes a data exchange protocol of a host connected to the memory system 1100. In addition, the error correction block 1114 detects and corrects errors included in data read from the semiconductor memory device 1120, and the memory interface 1115 performs interfacing with the semiconductor memory device 1120. In addition, the memory controller 1110 may further include read only memory (ROM) that stores code data for interfacing with the host.

The above-described memory system 1100 may be a memory card or a solid state disk (SSD) in which the semiconductor memory device 1120 and the memory controller 1110 are combined. For example, when the memory system 1100 is an SSD, the memory controller 1110 may communicate with an external device (for example, a host) through one of various interface protocols such as a universal serial bus (USB), a multi-media card (MMC), a peripheral component interconnection-express (PCI-E), a serial advanced technology attachment (SATA), a parallel advanced technology attachment (PATA), a small computer system interface (SCSI), an enhanced small disk interface (ESDI), and integrated drive electronics (IDE).

Figure 10:
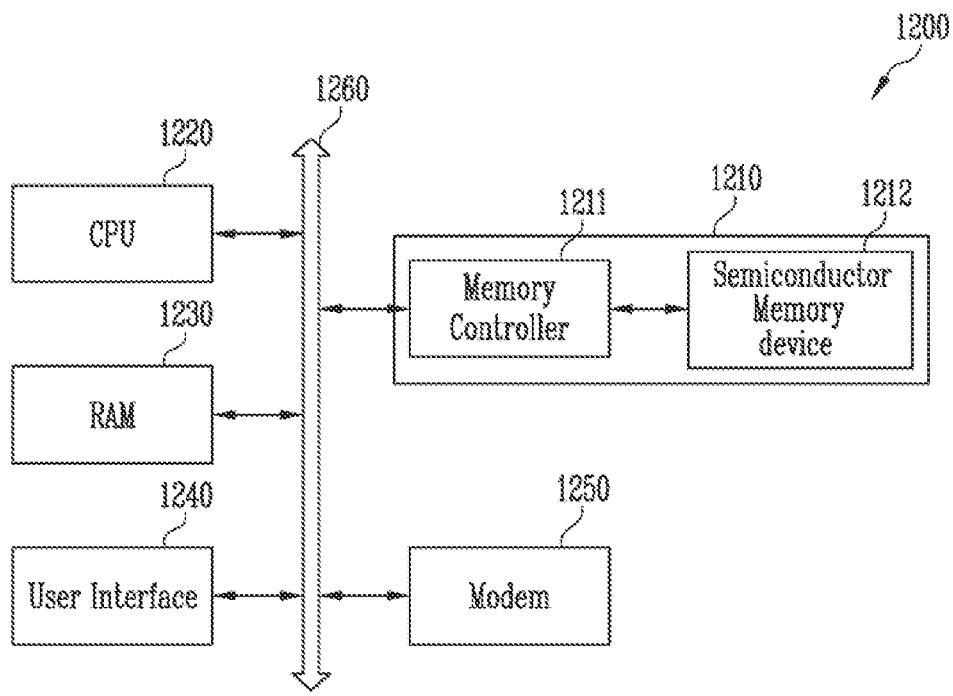
FIG. 10 is a block diagram illustrating a configuration of a computing system according to an embodiment of the present disclosure.

FIG. 10 is a block diagram illustrating a configuration of a computing system 1200 according to an embodiment of the present disclosure.

Referring to FIG. 10, the computing system 1200 may include a CPU 1220, random access memory (RAM) 1230, a user interface 1240, a modem 1250, and a memory system 1210 electrically connected to a system bus 1260. In addition, when the computing system 1200 is a mobile device, a battery for supplying an operation voltage to the computing system 1200 may be further included, and an application chipset, a camera image processor (CIS), a mobile DRAM, and the like may be further included.

Although the detailed description of the present disclosure describes specific embodiments, various changes and modifications are possible without departing from the scope and technical spirit of the present disclosure. Therefore, the scope of the present disclosure should not be limited to the above-described embodiments, and should be determined by the following claims and their equivalents.

What is claimed is:

1. A semiconductor memory device comprising:
    a gate stack including interlayer insulating layers and conductive patterns alternately stacked in a vertical direction;
    a channel structure passing through the gate stack and having an upper end protruding above the gate stack;
    a memory layer surrounding a sidewall of the channel structure; and
    a source layer formed over the gate stack,
    wherein the channel structure comprises:
    a core insulating layer extending in a central region of the channel structure in the vertical direction; and
    a channel layer surrounding a sidewall of the core insulating layer, the channel layer being lower in the vertical direction than the core insulating layer and the memory layer, and
    wherein the channel layer has an upper surface height equal to or higher than an uppermost conductive pattern among the conductive patterns.

2. The semiconductor memory device of claim 1, wherein the source layer comprises:
    a first source layer formed along a surface of an upper portion of the gate stack and the protruding upper end of the channel structure; and
    a second source layer formed on the first source layer.

3. The semiconductor memory device of claim 2, wherein the first source layer fills a space between an upper end of the memory layer and an upper end of the core insulating layer.

4. The semiconductor memory device of claim 2, wherein the first source layer is directly connected to an upper end of the channel layer.

5. The semiconductor memory device of claim 1, wherein the channel layer comprises an undoped polysilicon layer.

6. The semiconductor memory device of claim 2, wherein the first source layer comprises a doped polysilicon layer.

7. The semiconductor memory device of claim 6, wherein the second source layer comprises a metal material.

8. The semiconductor memory device of claim 1, wherein the channel layer has the upper surface height lower than an upper surface height of the gate stack.

9. The semiconductor memory device of claim 1, wherein the channel layer has the upper surface height lower than an upper surface height of the memory layer.

10. The semiconductor memory device of claim 1, wherein the uppermost conductive pattern is used as a source select line.

11. The semiconductor memory device of claim 1, wherein an upper surface height of the memory layer is equal to or lower than an upper surface height of the gate stack.

* * * * *